United States Patent
Coomer et al.

(10) Patent No.: US 6,612,590 B2
(45) Date of Patent: Sep. 2, 2003

(54) APPARATUS AND METHODS FOR MANIPULATING SEMICONDUCTOR WAFERS

(75) Inventors: Stephen D. Coomer, Tempe, AZ (US); John Francis McIntee, Gold Canyon, AZ (US); Jozsef Michael Iha, Gold Canyon, AZ (US); Robert T. Borra, Austin, TX (US); Eric Lusby, Mesa, AZ (US); Michael J. Lombardi, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/759,613

(22) Filed: Jan. 12, 2001

(65) Prior Publication Data

US 2002/0094260 A1 Jul. 18, 2002

(51) Int. Cl.$^7$ ................................................ B65G 47/24
(52) U.S. Cl. ........................ 279/158; 414/806; 414/755
(58) Field of Search ................................. 414/935, 941, 414/627, 217, 755, 806; 279/3, 158

(56) References Cited

U.S. PATENT DOCUMENTS

| | | | | |
|---|---|---|---|---|
| 4,904,012 A | * | 2/1990 | Nishiguchi et al. ............ 29/743 |
| 4,915,564 A | | 4/1990 | Eror et al. ..................... 414/217 |
| 4,938,654 A | | 7/1990 | Schram ......................... 414/757 |
| 5,105,147 A | | 4/1992 | Karasikov et al. ....... 324/158 F |
| 5,516,732 A | | 5/1996 | Flegal ........................... 437/250 |
| 5,651,724 A | * | 7/1997 | Kimura et al. ............... 451/285 |
| 5,700,046 A | * | 12/1997 | Van Doren et al. ........ 294/119.1 |
| 5,707,051 A | | 1/1998 | Tsuji ............................ 269/21 |
| 5,820,329 A | * | 10/1998 | Derbinski et al. ........... 269/903 |
| 5,888,127 A | * | 3/1999 | Piper et al. .................. 451/287 |
| 6,143,147 A | | 11/2000 | Jelinek .................... 204/298.15 |
| 6,203,408 B1 | * | 3/2001 | Quek ........................... 451/286 |
| 6,217,034 B1 | * | 4/2001 | Smedt et al. ................ 118/503 |
| 6,322,116 B1 | * | 11/2001 | Stevens ...................... 294/64.3 |

* cited by examiner

Primary Examiner—Dean J. Kramer
Assistant Examiner—Charles A. Fox
(74) Attorney, Agent, or Firm—Wood, Herron & Evans, L.L.P.

(57) ABSTRACT

Apparatus and methods for a wafer handling system that manipulates semiconductor wafers. The present invention includes an end effector having a vacuum chuck, an internal vacuum plenum, and a plurality of flow diverters positioned within the vacuum plenum to define vacuum distribution channels in fluid communication with respective vacuum ports of the vacuum chuck. The present invention also includes a vacuum chuck having flow diverters positioned in one or more internal vacuum plenums which are in fluid communication with the vacuum ports of the vacuum chuck. The flow diverters of the vacuum chucks adjust the vacuum pressure supplied to the vacuum ports such that, as vacuum ports are occluded by the wafer, the vacuum pressure is preferentially applied to unblocked vacuum ports for increasing the attractive force applied to unengaged portions of the wafer. The wafer handling system also includes a gas dispensing showerhead that may be positioned above a vacuum chuck for flattening the wafer so that a vacuum chuck can establish a secure engagement. The apparatus of the present invention has particularly utility for securing thin semiconductor wafers with a significant warpage.

11 Claims, 9 Drawing Sheets

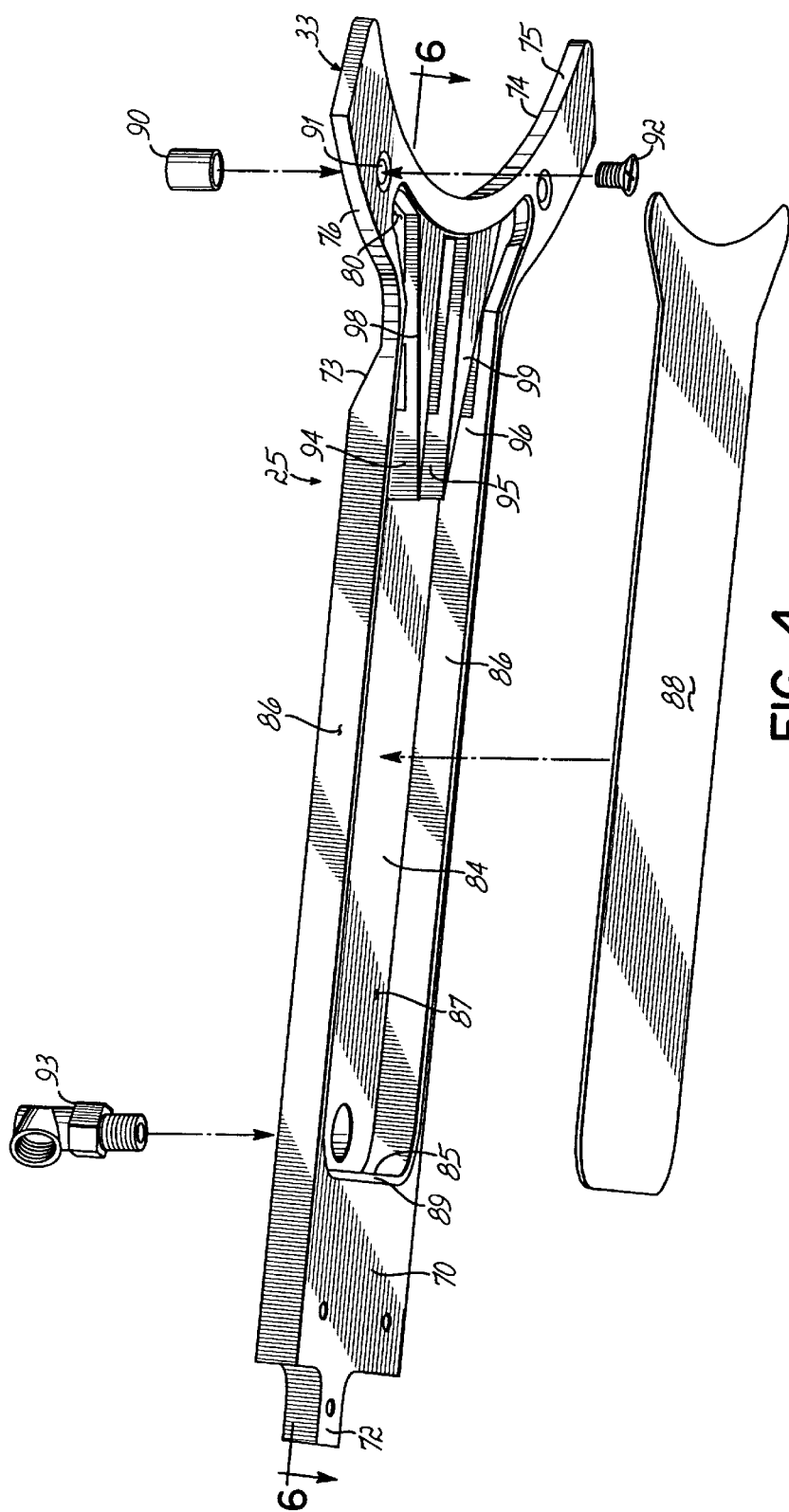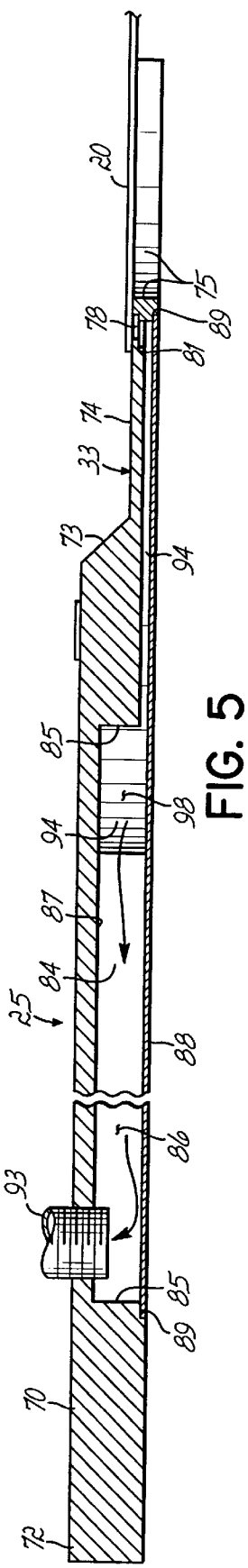

APPARATUS AND METHODS FOR MANIPULATING SEMICONDUCTOR WAFERS

This invention relates to the handling of semiconductor wafers, and more particularly, to wafer handling systems and methods optimized for the holding and transfer of semiconductor wafers, such as thin semiconductor wafers.

BACKGROUND OF THE INVENTION

The semiconductor industry requires automated wafer handling systems that can precisely handle semiconductor wafers or substrates, such as silicon wafers, of varying diameters, compositions and physical attributes and that can supply those wafers in a rapid, ordered succession to a wafer processing machine. Wafer handling generally entails removing each subject wafer from a wafer cassette, performing preprocessing operations, and individually loading the wafer into the wafer processing machine, followed by returning each processed wafer to a wafer cassette. In high-throughput wafer handling systems, wafers are manipulated or transferred among various locations within the wafer handling system by a robot having a transfer arm equipped with an end effector or a vacuum spatula that is adapted to manipulate and transfer. The wafer handling system typically includes a wafer aligning station for aligning and centering wafers and a load arm for inserting the centered and aligned wafers into a loadlock chamber of the wafer processing machine. The robot, transfer arm and end effector cooperate to place and remove wafers from the load arm, the wafer aligning station, and the wafer cassettes. To that end, the end effector, aligning station, and load arm have chucks, typically vacuum chucks, that securely hold the subject wafer in the vertical, horizontal, and inverted orientations required during the steps of the wafer-handling process.

A conventional chuck contacts an area on the backside or the device side of the wafer that suffices to provide a secure engagement. Certain conventional chucks restrict the contacted area to a narrow annular ring, termed the exclusion area, extending a predetermined distance radially inward from the peripheral rim of the wafer. The predetermined distance typically is less than or equal about 6 millimeters and is unpopulated by devices on the device side of the wafer. The utilization of the exclusion area permits the chucks of wafer handling systems to hold wafers by the device side without damaging devices that may be present during backside treatment and, during device side treatment, to hold wafers by the back side without disturbing any backside treatment. As a result, the exclusion area provides a 6-mm wide annular zone about the peripheral edge that chucks can safely utilize to reliably hold the wafer. One such wafer handling system is described in U.S. Pat. No. 5,820,329, hereby expressly incorporated by reference in its entirety herein.

Silicon wafers are typically manufactured according to standardized specifications which, among other dimensional tolerances, require the surface for receiving devices thereon to be substantially planar with a flatness of 1.5 microns or less. As-manufactured 150 mm silicon wafers, for example, have a standard diameter of 150±0.2 mm and a standard thickness of 675±25 microns. Silicon wafers are usually provided with a flat or a notch used for alignment and indicative of crystalline orientation. Although processed wafers vary in thickness depending upon the end product and the initial wafer diameter, a typical wafer thickness after processing ranges from about 500 microns to about 700 microns. The device fabrication process may introduce additional warpage or bowing that exceeds the flatness in an unprocessed state. For certain end applications, devices and integrated circuits are fabricated on thin silicon wafers having an average thickness of less than or equal to about 150 microns and exhibiting a warpage of as large as about 12.5 mm. Thin wafers are particularly useful in integrated circuit applications, for example, where the heat generated by devices during operation demands an enhanced thermal conduction through the thinned wafer to a heat sink, attached to the back side, in order to prevent overheating of the device side and loss or impairment of functionality.

The vacuum chucks of conventional wafer handling systems, under certain circumstances, are unable to engage the subject wafers in a fashion adequate for secure transfers. Conventional vacuum chucks cannot apply an adequate vacuum distribution over the exclusion area to be chucked. As a result, the wafer is not adequately secured for vertical and inverted orientations of the chuck and may even be dropped by the chuck during movement when the chuck is oriented horizontally. In particular, conventional wafer handling systems and vacuum chucks are unsuited for holding and transferring warped thin semiconductor wafers between locations within the system. In addition, the warpage of thin wafers hinders the accuracy of the alignment and centering operations performed by the aligning station. Therefore, conventional vacuum chucks employed in conventional wafer handling systems cannot apply an adequate gripping force such that thin wafers can be gripped or, if successfully gripped, manipulated about the wafer handling system without a significant risk of dropping the subject wafer.

Accordingly, there is a need for wafer handling systems and wafer handling techniques that can improve the handling of wafers and, in particular, thin wafers, by enhancing the ability of the vacuum chucks of the wafer handling system to secure and hold wafers during handling.

SUMMARY OF THE INVENTION

The present invention provides improved vacuum chucks and end effectors for a wafer handling device with an enhanced vacuum capability compared with conventional vacuum chucks and end effectors. The improved vacuum chucks and end effectors of the present invention are capable of handling common semiconductor wafers and specialized classes of semiconductor wafers, such as thin wafers. The improved vacuum chucks and end effectors have an increased conductance and segmented vacuum slots that assist in applying an attractive force sufficient to pull the exclusion are of the wafer to the contact the chuck or end effector and be secured thereto. As a result, wafer can be safely manipulated by the wafer handling system without a significant risk of either dropping or breaking the wafer.

According to the present invention, an end effector to hold and support a wafer comprises an effector body having a support surface for supporting the wafer thereupon and an internal vacuum plenum. The support surface comprises a plurality of vacuum ports arranged in a mutually spaced relationship. The internal vacuum plenum is connected for fluid communication with a vacuum source, which is operable for evacuating air from the internal vacuum plenum to thereby apply a subatmospheric pressure thereto. The vacuum plenum includes a plurality of flow diverters configured to divide the vacuum plenum into a plurality of vacuum distribution channels. At least one of the plurality of vacuum distribution channels is in fluid communication with at least one of the plurality of vacuum ports. The flow diverters are operable for redirecting the subatmospheric pressure to the vacuum distribution channels serving the vacuum ports unblocked by a portion of the wafer as each of said vacuum ports is occluded by a portion of the wafer.

According to the present invention, a vacuum chuck for holding and supporting a surface of a wafer comprises a chuck body with an outer periphery and an internal vacuum plenum of a predetermined height. A plurality of flow diverters are formed in the vacuum plenum. An annular rim is disposed about the outer periphery of the chuck body and defines a support surface for supporting a wafer thereon. Formed on the annular rim is a plurality of vacuum ports which are each in fluid communication with the vacuum plenum. A vacuum source is connected in fluid communication to the vacuum plenum and is operable for evacuating the vacuum plenum to a subatmospheric pressure. The flow diverters determine which of the plurality of vacuum ports, that are unobstructed, are to receive an increased subatmospheric pressure as the surface of the wafer partially engages the support surface and occludes certain of the plurality of vacuum ports.

According to the present invention, an apparatus for flattening a wafer comprises a source of a wafer-flattening gas, a wafer support, and a gas dispensing showerhead. The wafer support has a wafer supporting surface thereon adapted for contacting a first surface of the wafer. The showerhead comprising a tubular member connected for fluid communication with the source of wafer-flattening gas and a plurality of gas outlets positioned in a spaced relationship about the circumference of the tubular member, said tubular member suspended a predetermined distance above the surface of the wafer support, said plurality of gas outlets having a confronting relationship with the surface of the wafer support. The gas outlets are adapted to eject a flow of the wafer-flattening gas from the source against the first surface of a wafer supported on the wafer supporting surface for applying a force directed to press the second surface of the wafer against the wafer support surface.

Embodiments of the apparatus of the present invention may be provided in the form of a retrofit kit that includes an end effector and vacuum chuck of the present invention configured to replace the end effector and the vacuum chuck of the wafer aligning station of existing wafer handling systems and gas dispensing showerheads adapted to be installed adjacent to the vacuum chuck of the wafer aligning station and the vacuum chucks of the load arm.

According to the present invention, a method for securing a wafer against a support surface comprises positioning a first surface of a wafer proximate to the support surface and directing a flow of a wafer-flattening gas against a second opposite surface of the wafer for applying a force that presses at least a portion of the first surface of the wafer against the support surface.

According to the present invention, a method for securing a surface of a wafer to a support surface of a vacuum chuck comprises providing a plurality of vacuum ports in the support surface of the vacuum chuck which are in fluid communication with an internal vacuum plenum inside the vacuum chuck. The internal vacuum plenum is evacuated by a selectively-operable vacuum source. A vacuum pressure is applied to the vacuum plenum with the vacuum source and the surface of the wafer is positioned proximate to at least a majority of the plurality of vacuum ports. The surface of the wafer is allowed to occlude one of the vacuum ports and the vacuum pressure at the vacuum ports that remain unblocked is adjusted by diverting the vacuum pressure so that the unblocked vacuum ports receive a greater vacuum pressure and thereby apply a greater attractive force to the surface of the wafer.

The above and other objects and advantages of the present invention shall be made apparent from the accompanying drawings and the description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

FIG. 4 is an exploded perspective bottom view of one embodiment of the end effector of FIG. 1;

FIG. 5 is a cross-sectional view taken along line 5—5 of FIG. 4;

DETAILED DESCRIPTION OF SPECIFIC EMBODIMENTS

Figure 1:
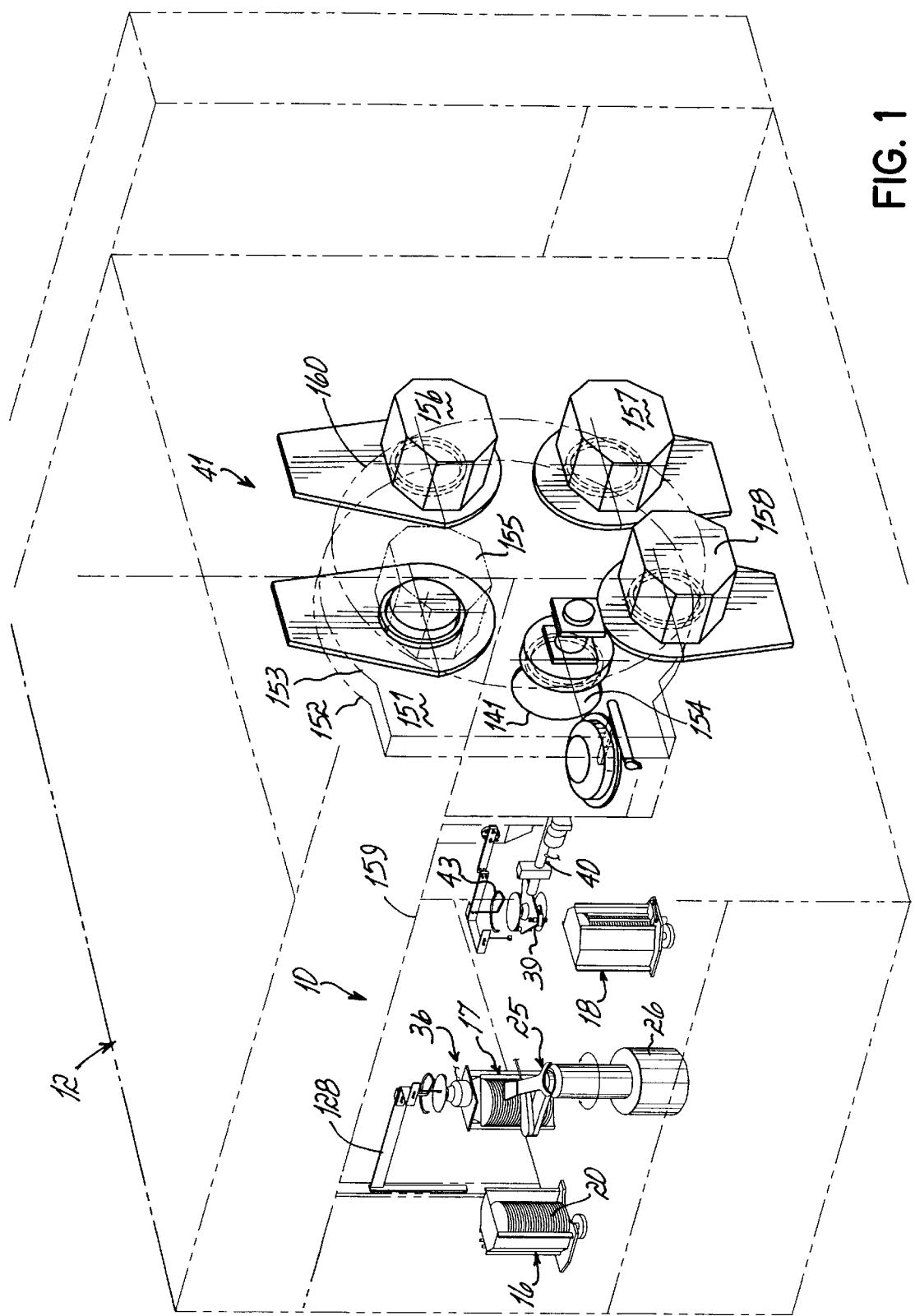
FIG. 1 is a perspective view illustrating a wafer handling system according to one embodiment of the present invention.

The present invention is a wafer handling system, indicated generally by reference numeral 10, as diagrammatically illustrated in FIG. 1, for holding and transferring semiconductor wafers 20 or other substrates that require an improved holding capability for secure handling. The wafer handling system 10 is capable of providing a succession of semiconductor wafers to, and retrieving processed wafers from, wafer processing machines, cluster tool type machines, and other wafer processing equipment. Exemplary wafer processing machines having a high-throughput are illustrated and described in U.S. Pat. Nos. 4,915,564 and 5,516,732, both expressly incorporated by reference herein. The described embodiments of the present invention may be retrofitted to existing wafer handling systems without significant modification.

Semiconductor wafers 20, hereinafter wafers, may be formed of silicon or gallium arsenide and may include patterned areas of metallization, contacts, insulating layers and the like. An example of wafers 20 with which the apparatus and methods of the present invention have a particular utility are thin wafers having a significant warpage. For example, a thin wafer of silicon having an average thickness of between about 150 microns and about 75 microns exhibits a bowing or warpage of less than or equal to about 12.5 mm, where the warpage is measured from the point on the wafer surface of greatest concavity to the point of greatest convexity. Thin wafers and substrates are relatively flexible due to their reduced thickness. An exemplary thin wafer with significant warpage is illustrated in phantom in FIG. 7. The wafer handling system 10 of the present invention may also have particular utility for handling thin substrates, other than thin wafers, exhibiting a significant warpage.

Figure 1A:
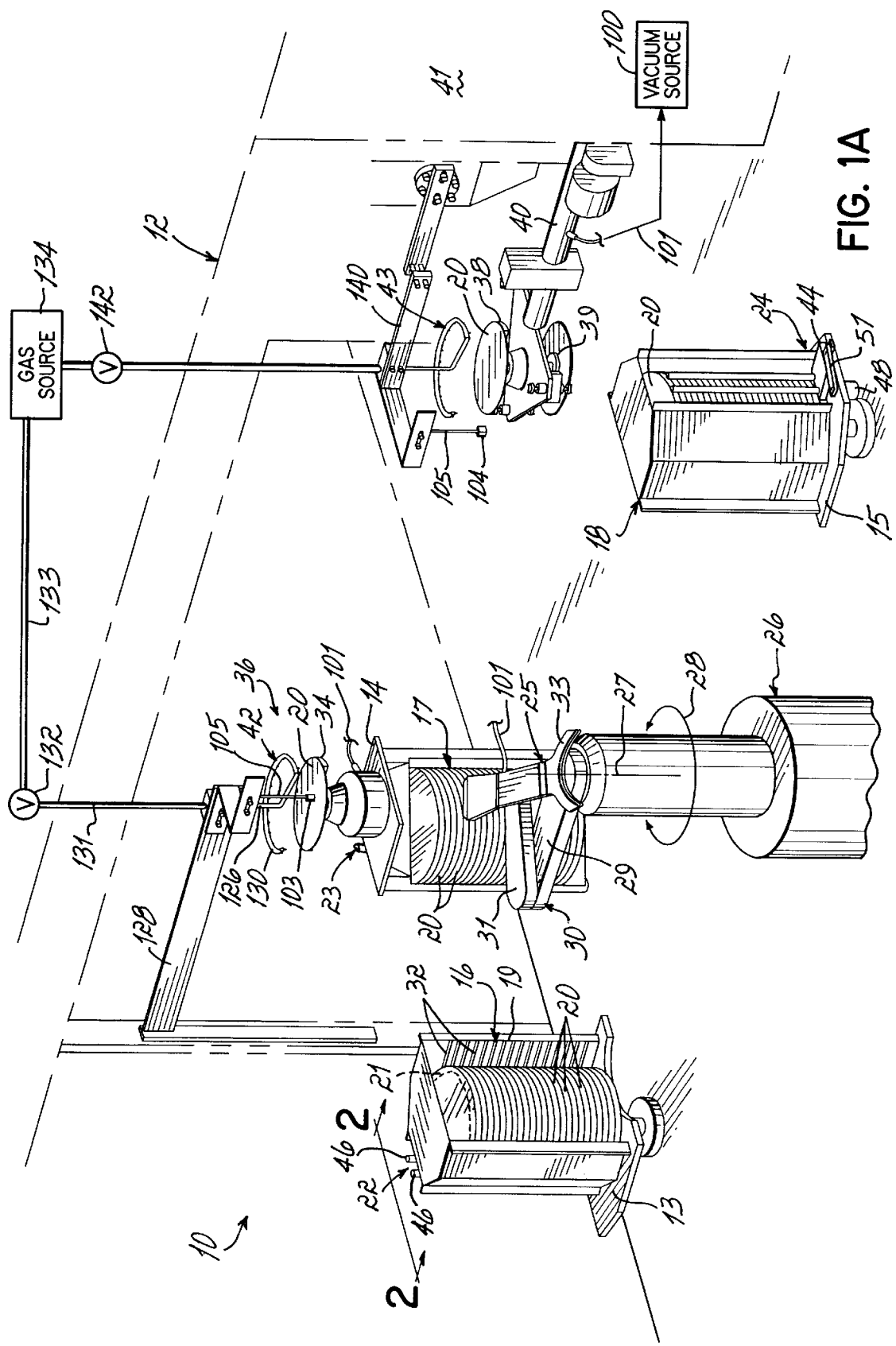
FIG. 1A is an enlarged perspective diagram of a portion of FIG. 1.

Defined on the surface of each wafer 20 is an exclusion area 21 which consists of an annular surface area extending about the entire circumference of wafer 20, as illustrated in FIG. 1A. On the device side of wafer 20, devices are restricted to an area of the surface lying peripherally within the exclusion area 21. The exclusion area 21 is dedicated for use as a gripping, holding or contact zone for wafer handling. Typically, the exclusion area 21 extends 6 mm or less radially inward from the peripheral edge of wafer 20 and encircles the entire peripheral edge of wafer 20.

With reference to FIG. 1, the wafer handling system 10 is housed within an enclosure 12, illustrated in phantom containing a environmentally-controlled, cleanroom-type atmosphere and is positioned adjacent to a wafer processing machine 41. The wafer processing machine 41 includes main vacuum chamber 151, which is in the form of a disc-shaped plenum enclosed between two generally circular walls 152, 153 with a plurality of, for example, five, treatment stations 154–158 spaced at equal angular intervals around a central horizontal axis 159. Within the chamber 151, mounted for rotary movement on the axis 159, is a circular index plate 160 having five circular openings 141 therein equally spaced to simultaneously align with each of the treatment stations 154–158. A least one of the five treatment stations 154–158, for example, station 154, is a loadlock chamber through which wafers 20 are inserted into and removed from the main chamber 51. The loadlock chamber 154 is isolated from the environment outside enclosure 12 as well as being selectively isolated from the environment inside the enclosure 12 for the wafer handling system 10. The remaining treatment stations 155–158 include any of a number of types of treatment stations, such as sputter coating stations or sputter etching stations.

The wafer handling system 10 includes three pedestals 13, 14, 15, wherein each pedestal 13–15 supports a respective one of three wafer cassettes 16–18. Each of wafer cassettes 16–18 has a rack 19 configured to support a vertical stack of horizontally-oriented wafers 20 in substantially parallel and substantially spaced relationship and to contact each wafer 20 only within its exclusion area 21. Each of the pedestals 13–15 is equipped with one of three pusher mechanisms 22, 23, 24 that is operable to selectively move the wafers 20 in the associated wafer cassette 16–18 horizontally by a distance such that the wafers 20 are translated linearly into a transfer position for loading or unloading onto an end effector 25.

The wafer handling system 10 includes an r-θ-z robot 26 that is capable of translating along a vertical z-axis 27 and rotating, as indicated generally by arrow 28, in a horizontal plane oriented generally orthogonal to the vertical z-axis 27. A wafer transfer arm 30 is attached to the robot 26 and has two pivotably-interconnected arm segments 29 and 31 that are moveable relative to one another so that the overall length of transfer arm 30 can be increased and decreased. Attached at the free end of the transfer arm 30 is the end effector 25 which incorporates an end effector vacuum chuck 33 utilized for selectively engaging and holding a wafer 20 in a secure fashion. The robot 26, transfer arm 30 and end effector 25 are collectively capable of cooperating to lift and remove wafers 20 from the cassettes 16–18, insert wafers 20 into the cassettes 16–18, route wafers 20 to and from an aligning station vacuum chuck 34 of a wafer aligning station 36, and route wafers 20 to and from one of a pair of load arm vacuum chucks 38, 39, each similar to aligning station vacuum chuck 34, located at the end of a load arm 40. The load arm 40 is operable for orienting a wafer 20 to permit transfer to and from loadlock chamber 154 providing environmentally-controlled access to the wafer processing machine 41.

Suspended in a spaced and substantially confronting relationship generally above the aligning station vacuum chuck 34 is a gas dispensing showerhead 42 which is selectively operable for emitting plural streams of wafer-flattening gas when end effector 25 positions wafer 20 proximate to the aligning station vacuum chuck 34. A gas dispensing showerhead 43, similar to gas dispensing showerhead 42, is suspended in a substantially facing and spaced relationship with respect to the load arm vacuum chuck 38. Gas dispensing showerhead 43 is selectively operable for emitting plural streams of wafer-flattening gas when end effector 25 positions wafer 20 adjacent to the load arm vacuum chuck 38.

The wafer handling system 10 is interfaced with a control system (not shown), that operates in coordination with the operation of the wafer processing machine 41. The control system issues instructions and commands that control and orchestrate the operation of the robot 26, transfer arm 30, vacuum chucks 33, 34, 38, 39, wafer aligning station 36, load arm 40, gas dispensing showerheads 42, 43, and other components of the wafer handling system 10.

Figure 2:
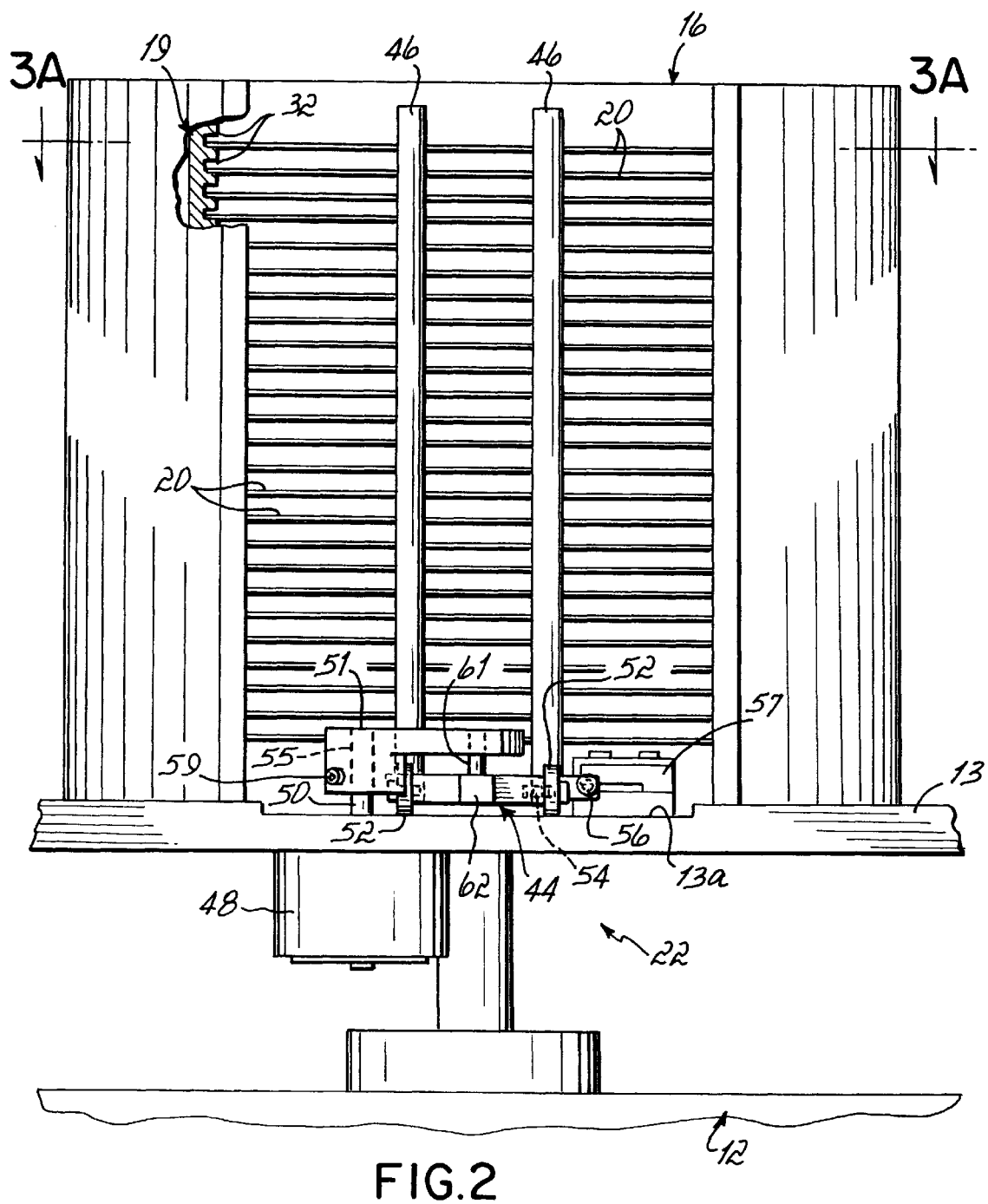
FIG. 2 is a rear view taken along line 2—2 of FIG. 1A of one embodiment of the pusher assembly of the present invention.

In an exemplary wafer handling system 10, wafer cassette 16 initially contains wafers 20 for processing by wafer processing machine 41, wafer cassette 17 is initially empty for receiving wafers 20 processed by wafer processing machine 41, and wafer cassette 18 contains dummy wafers used for "burn-in" of the treatment stations 155–158 of wafer processing machine 41. Wafers 20 from wafer cassette 18 are positioned in the wafer holders of the treatment stations 155–158, for example, to collect deposition material from a treatment station when surface contamination or oxidation is removed from the target surface of a sputter coating source. Referring to FIG. 2, the rack 19 of each wafer cassette 16, as well as wafer cassettes 17, 18, is adapted to provide a predetermined vertical spacing between adjacent wafers 20 to accommodate the maximum expected warpage. For example, if the maximum expected warpage is about ½ inch, then the vertical spacing is selected to exceed ½ inch, such as a vertical spacing about ⅝ inch. To that end, rack 19 is provided with a plurality of pairs of opposite slots 32 that are spaced apart in a horizontal plane by a given distance suitable to receive wafers 20 of a specified diameter, such as 125 mm or 150 mm silicon wafers. Each pair of the plurality of opposite slots 32 is adapted to contact and support one of the wafers 20 with contact limited to the exclusion area 21.

Figure 3A:
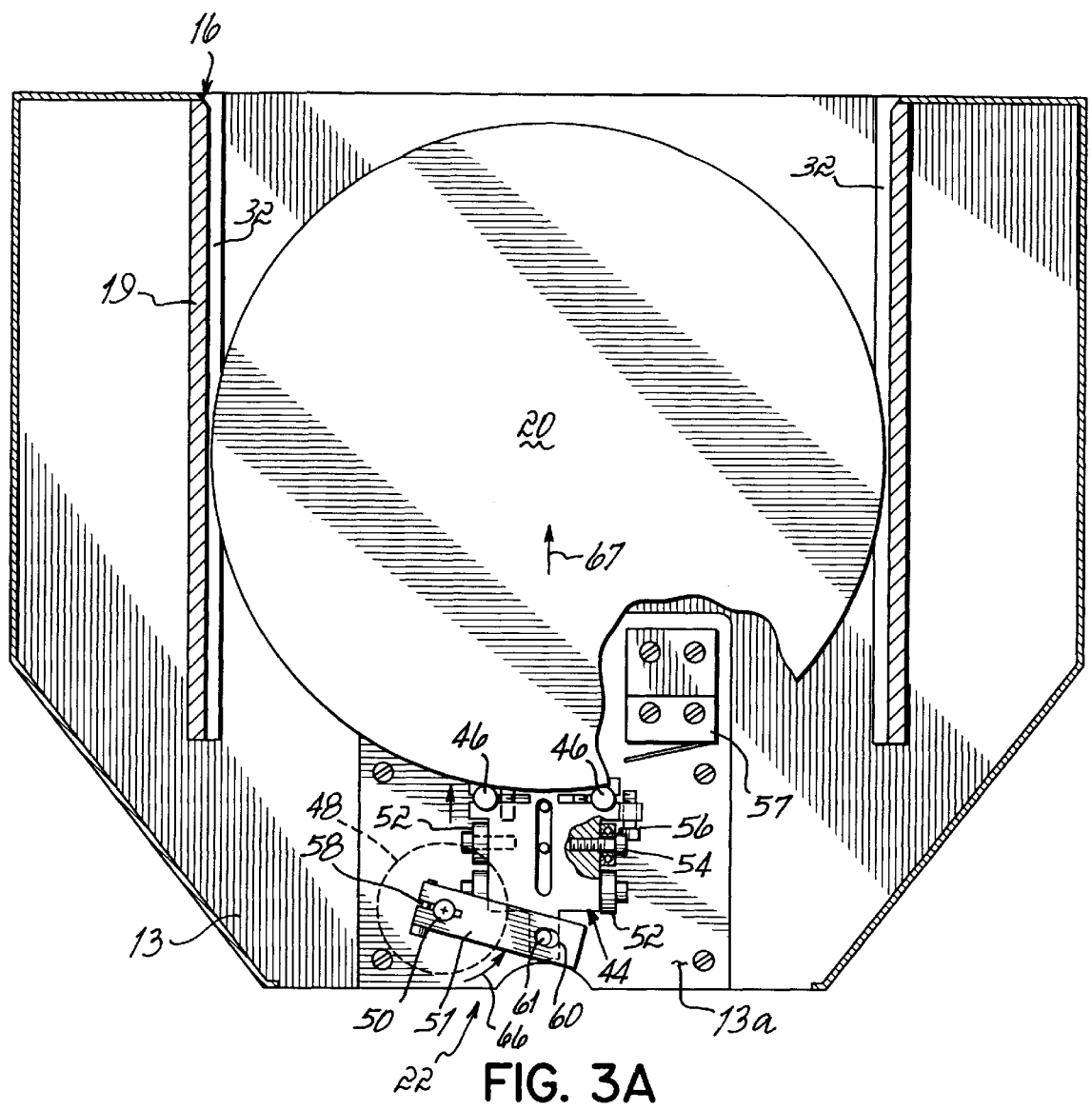
FIG. 3A is a cross-sectional view taken along line 3A—3A of FIG. 2.
Figure 3B:
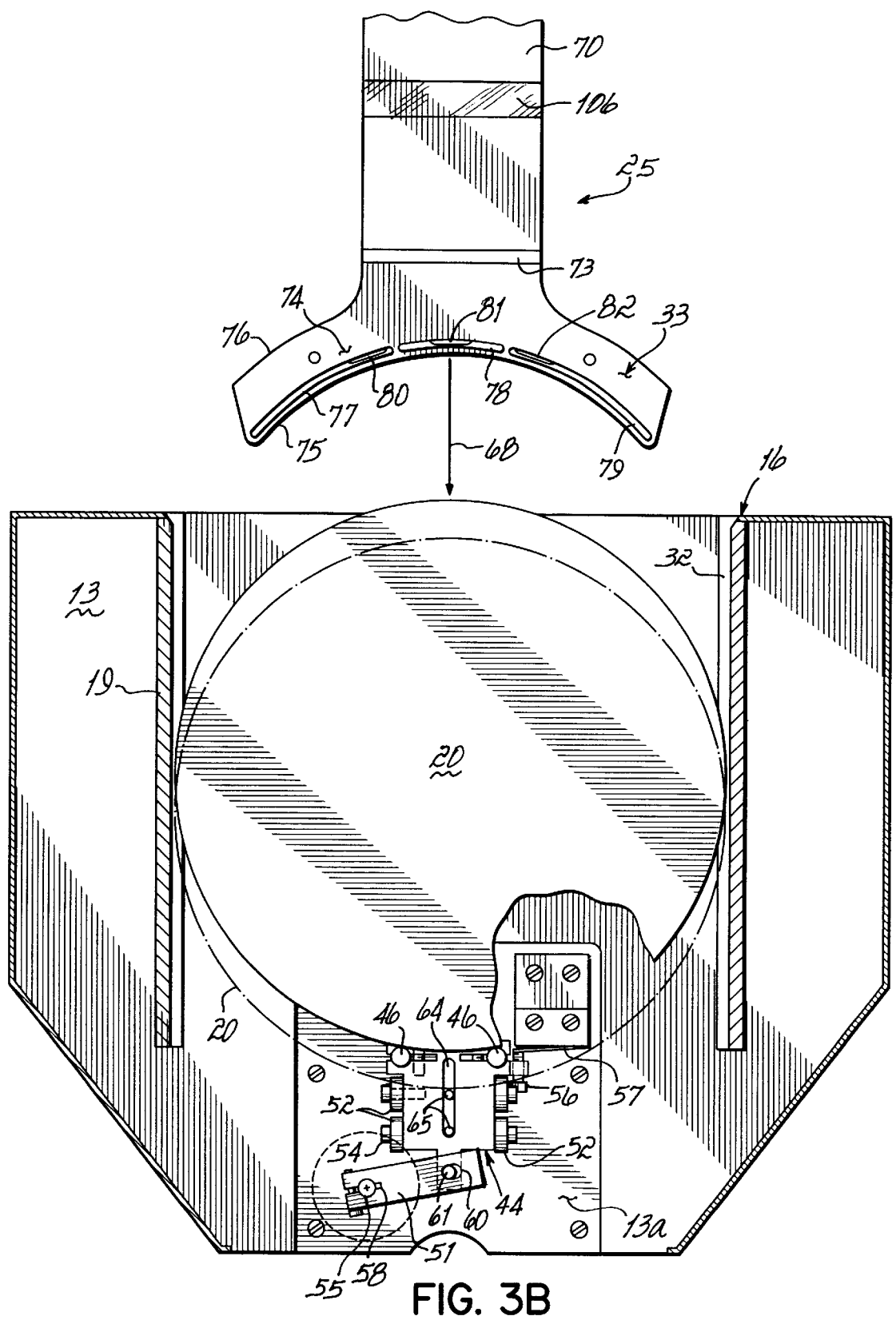
FIG. 3B is a top view, similar to FIG. 3A, illustrating the end effector of the wafer transfer arm positioned to remove a wafer pushed from the wafer cassette by the pusher assembly.

Pusher mechanism 22 is adapted to perform a driving operation to simultaneously push all wafers 20 in wafer cassette 16 from an initial position, shown in phantom lines in FIG. 3B, to a transfer position, shown in solid lines in FIG. 3B. With reference to FIG. 2, wafer 20 is transferable from the transfer position to the end effector 25 on the transfer arm 30. In a typical driving operation for 125 mm and 150 mm wafers, the pusher mechanism 22 translates wafers 20 a predetermined distance of about ⅜" from their initial positions in rack 19, which provides a sufficient protrusion such that end effector 25 can access and individually grasp each wafer 20. Pusher mechanisms 23 and 24 are identical to pusher mechanism 22 and are each adapted to perform a driving operation for pushing wafers 20 from their initial positions in wafer cassettes 17 and 18, respectively, for access by and transfer to end effector 25. Accordingly, the following detailed description of pusher mechanism 22 is applicable for describing either of pusher mechanisms 23 and 24.

Pusher mechanism 22 comprises a wheeled shuttle or carriage 44, a pair of wafer-engaging posts 46 carried by the carriage 44, a rotary actuator 48, a shaft 50 connected for rotary movement to the actuator 48, and a lever arm 51 that operably connects the carriage 44 to the shaft 50. Carriage 44 is positioned in a recessed portion 13a of pedestal 13 proximate to the base of the wafer cassette 16. The presence of recessed portion 13a in pedestal 13 ensures that carriage 44 does not contact wafer cassette 16 during movement. A pair of wafer-engaging posts 46 extend vertically from carriage 44 for a distance sufficient to contact all wafers 20 carried by the rack 19 of wafer cassette 16, when actuated by rotation of rotary actuator 48. Rotary actuator 48 may powered electrically, such as by a stepper motor, or pneumatically.

With reference to FIG. 3A, a plurality of wheels 52 are rotatably attached to the carriage 44 by a respective one of plural axles 54. Wheels 52 support carriage 44 for movement atop pedestal 13. Attached to the carriage 44 is a plunger 56 adapted and positioned to selectively engage and actuate a microswitch or limit switch 57. It is apparent to those of ordinary skill in the art that the limit switch 57 and the plunger 56 could be replaced by an optical sensor for the purpose of limiting the range of motion of carriage 44 and defining the predetermined distance that the wafers 20 are translated. A shaft portion 55 of shaft 50 extends through, and is captured within, a cleft opening 58 provided in one end of lever arm 51. A fastener 59 applies a tangential compressive force to clamp the cleft opening 58 about the exterior of the shaft portion 55. An opposite end of lever arm 51 includes an oval bore 60 that receives a pin 61 extending vertically from a tang 62 attached to carriage 44. Lever arm 51 is pivotably attached to carriage 44 via pin 61 and bore 60. An elongate oval slot 64 is provided in carriage 44 and receives therein a pair of guide pins 65 that extend upwardly from recessed portion 13a. The guide pins 65 are spaced apart and are generally aligned with the centerline of wafers 20. Oval slot 64 likewise has a major axis generally aligned with the centerline of wafers 20. According to the present invention, the engagement between guide pins 65 and oval slot 64 serves to convert the rotary motion of rotary actuator 48 into a linear movement of carriage 44.

To perform a driving operation, the control system for the wafer handling system 10 sends a control signal to the rotary actuator 48 when the presence of a wafer cassette is detected on a pedestal, such as when wafer cassette 16 is sensed as present on pedestal 13. The rotary actuator 48 responds to the control signal by rotating the shaft 50 in a rotational sense indicated generally by arrow 66. As shaft 50 pivots, the lever arm 51 is constrained by the engagement between cleft opening 58 and shaft portion 55 to pivot, and thereby, to force carriage 44 to roll from a home position (FIG. 3A) along the recessed portion 13a of the pedestal 13. Carriage 44 is constrained by the engagement between oval slot 64 and guide pins 65 such that the motion of shuttle 44 is a controlled linear translation toward the wafers 20 that lacks significant pivoting or rotational motion. As the carriage 44 translates linearly, the wafer-engaging posts 46 strike the peripheral rim of each wafer 20 held in rack 19 and translate each wafer 20, without significant rotation, the predetermined distance in the direction of arrow 67.

The pusher mechanism 22 linearly translates each wafer 20 from its initial horizontal position in rack 19 of wafer cassette 16 until the plunger 56 depresses the limit switch 57, as shown in FIG. 3B. When the limit switch 57 is closed, a signal is sent to the control system which instructs the rotary actuator 48 to reverse its direction of rotation and return the carriage 44 to its home position. Following the driving operation, the wafers 20 protrude the predetermined distance from wafer cassette 16 such that end effector 25 can obtain access to the individual wafers 20. The end effector 25 is moved to the vicinity of the wafer cassette 16 after the pusher mechanism 22 performs a driving operation and approaches the peripheral rim of one of the wafers 20, protruding from the wafer cassette 16, generally in the direction of arrow 68 and in a horizontal plane slightly below the horizontal bottom surface of the wafer 20.

In the manufacture of semiconductor devices and with reference to FIG. 1, the wafer handling system 10 handles the wafers 20 by the device side for transfer to the wafer processing machine 41. When processing the backside of the wafer 20, the wafer 20 is inverted and the vacuum chucks 33, 34, 38, 39 of the wafer handling system 10 engage the device side of the wafer 20 within the exclusion area 21. Moreover, when preforming a device side treatment, contact between vacuum chucks 33, 34, 38, 39 and the backside of the wafer 20 is restricted to the exclusion area 21 to avoid significant damage to any backside treatment. Whether holding wafer 20 by the device side or the backside, the vacuum chucks 33, 34, 38, 39 preferably contact a significant arc of wafer 20 within the exclusion area 21.

Referring to FIGS. 3B, 4 and 5, the end effector 25, typically made of aluminum, comprises an elongate body 70 having an attachment portion 72 at one end joined by a beveled region 73 to end effector vacuum chuck 33 at an opposite end. The attachment portion 72 is configured for mounting end effector 25 to the arm segment 31 of wafer transfer arm 30. The end effector vacuum chuck 33 comprises a support surface 74 terminated by a concave inner peripheral edge 75 and a convex outer peripheral edge 76. The support surface 74 has a curved shape with a given radius of curvature and an arc length related to the particular diameter of the wafers 20 being handled by the wafer handling system 10. It is apparent that the support surface 74 may be substantially planar or flat but is not so limited. In one exemplary embodiment suitable for handling wafers 20 having a 150 mm diameter, the support surface 74 has a radius of curvature measured to the intersection of beveled edge 73 of about 75 mm and subtends an angular arc of less than or equal to about 100°. The support surface 74 has a radial width measured, for example, from inner peripheral edge 75 to the outer peripheral edge 76 less than or equal to the extent of the exclusion area 21 of the wafers 20 being handled by the wafer handling system 10.

The support surface 74 comprises a trio of vacuum ports 77, 78, 79 which are positioned in a spaced relationship with respect to each other and located in an angular arc about the support surface 74. The distribution of the attractive force supplied by the suction of end effector vacuum chuck 33 can be determined as desired according to the variation in the distance between, and opening size, of vacuum ports 77–79, as well as by varying the number of vacuum ports. Thus, the present invention is not limited by the particular configuration of the vacuum ports 77–79 illustrated in FIGS. 3B, 4 and 5. The vacuum ports 77–79 are in fluid communication with a selectively operable vacuum source of subatmospheric pressure, such as vacuum source 100, so that when the vacuum source 100 is actuated, the wafer 20 is drawn by the differential pressure acting on its two opposite upper and lower sides toward the support surface 74. When the vacuum ports 77–79 are covered or occluded, the exclusion area 21 of the wafer 20 is held in a secure contact against support surface 74 by the force due to the pressure differential between atmospheric pressure within enclosure 12 and the subatmospheric pressure supplied to the vacuum ports 77–79. Each of the vacuum ports 77–79 is in fluid continuity with a selected one of vacuum passageways 80, 81, 82. In an exemplary embodiment for securing a wafer 20 of thin silicon having a 150 mm diameter and up to a 12.5 mm warpage, a suitable vacuum or subatmospheric pressure, measured near the vacuum source 100, is about 250 mTorr.

Referring to FIGS. 4 and 5, the body 70 of the end effector 25 includes a vacuum plenum 84 partially surrounded by a pair of side walls 86, a pair of end walls 85, an upper wall 87, and a cover plate 88. The cover plate 88 is shaped and configured to be attached in an air-tight fashion to a ledge 89 extending about an inner perimeter of the side wall 86. The sealed attachment between cover plate 88 and ledge 89 can be created, for example, using a vacuum-compatible epoxy. Inserts 90 are positioned in countersunk openings 91 and are adapted with internal threads for mating with threaded fasteners 92. Inserts 90 may contact the peripheral edge of wafer 20 to assist in guiding the wafer 20 onto the support surface 74 containing the vacuum ports 77–79 to ensure correct wafer positioning. The vacuum plenum 84 is connected for fluid communication via a fitting 93 mounted in an opening provided in the upper wall 87. Fitting 93 is further connected via a vacuum line (FIG. 1A) to the selectively operable vacuum source 100. Near one of the end walls 85, the vacuum plenum 84 is compartmentalized into three vacuum distribution channels 94, 95, 96 by a pair of flow diverters 98, 99. The cross-section of each of the vacuum distribution channels 94, 95, 96 narrows to define narrowed channel segments 102a, 102b, 102c that extend to, and are in fluid communication with, internal entrances to vacuum passageways 80, 81, 82, respectively.

According to the present invention, the presence of the flow diverters 98, 99 optimizes the distribution of the attractive suction forces applied to the exclusion area 21 of the wafer 20 which is to be held and supported on the support surface 74 of end effector vacuum chuck 33. When the end effector 25 is positioned such that the vacuum ports 77–79 are proximate to the exclusion area 21 of the wafer 20, the attractive force applied by the suction of the vacuum ports 77–79 will act on the nearby surface area of the wafer 20. The portion of the wafer 20 lying closest to at least one of the vacuum ports 77–79, for example, vacuum port 77, will experience the greatest initial attractive force and be drawn into contact with the support surface 74 to occlude vacuum ports 77 and close a corresponding one of the vacuum distribution channels 94–96. Because of the presence of flow diverters 98, 99, the attractive force applied to the nearby portions of the wafer 20 by vacuum ports 78, 79 will be increased as the respective two opens one of the vacuum distribution channels 95, 96 compartmentalize the suction thereto. Similarly, when one of the vacuum ports 78–79, for example, vacuum port 78, is occluded by the exclusion area 21 of the wafer, the attractive force applied by the remaining uncovered vacuum ports 79 will be increased as the vacuum is routed by the vacuum distribution channel 96 that remains open. The occlusion of vacuum ports 77–79 by the exclusion area 21 of the surface of the wafer 20 activates a wafer presence detector in the vacuum line 101 which in turn sends a signal to the control system indicating that the end effector vacuum chuck 33 has successfully captured wafer 20 against the support surface 74.

Figure 6:
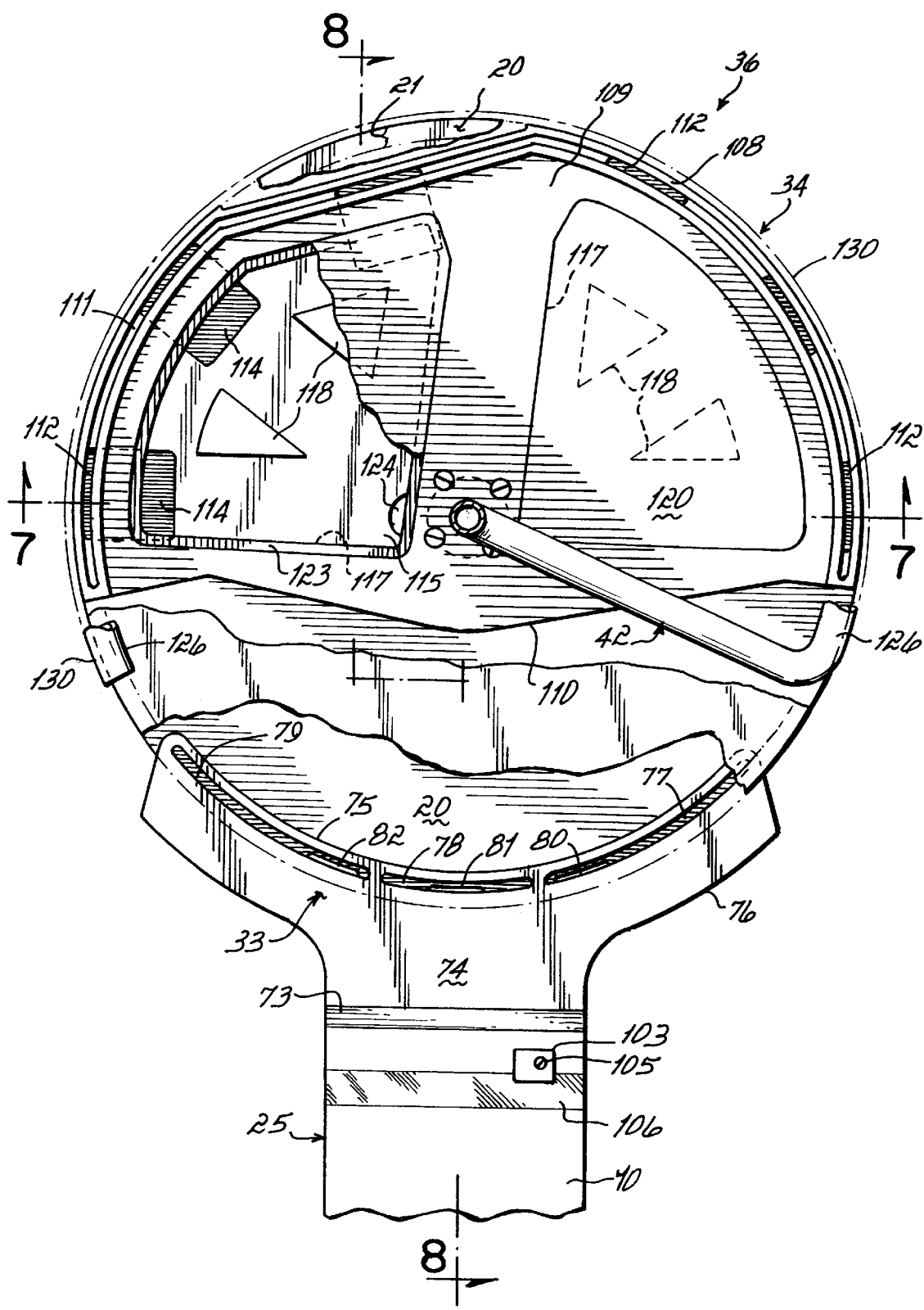
FIG. 6 is an enlarged top view of the wafer aligning station and gas dispensing showerhead of FIG. 1.

Referring to FIGS. 1 and 6, sensors 103, 104 are suspended from the ends of masts 105 near the wafer centering chuck 34 and the load arm chuck 39, respectfully. Each of sensors 103, 104 is configured with a light source oriented to downwardly emit a beam of light having certain characteristics, such as wavelength and intensity, and a light detector oriented to sense whether or not a portion of the beam of light emitted by the light source is returned by reflection. An optical reflector 106 (FIGS. 3B and 6) is provided on the body 70 of the end effector 25 and is formed of a highly reflective material, such as a polished aluminum. With reference to FIG. 6, when end effector 25 approaches the vicinity of wafer aligning station 36, sensor 103 will sense light reflected from optical reflector 106 as the optical reflector 106 traverses though the optical path of the beam of light emitted by sensor 103. The detection of reflected light indicates that the presence of end effector 25 in a specific position adjacent the wafer aligning station 36. The sensor 103 then transmits a signal to the control system for triggering suitable responsive actions, such as emitting a burst of wafer-flattening gas from showerhead 42. Similarly, sensor 104 is utilized to sense when end effector 25 is in a specific position near the load arm vacuum chuck 38.

Figure 8:
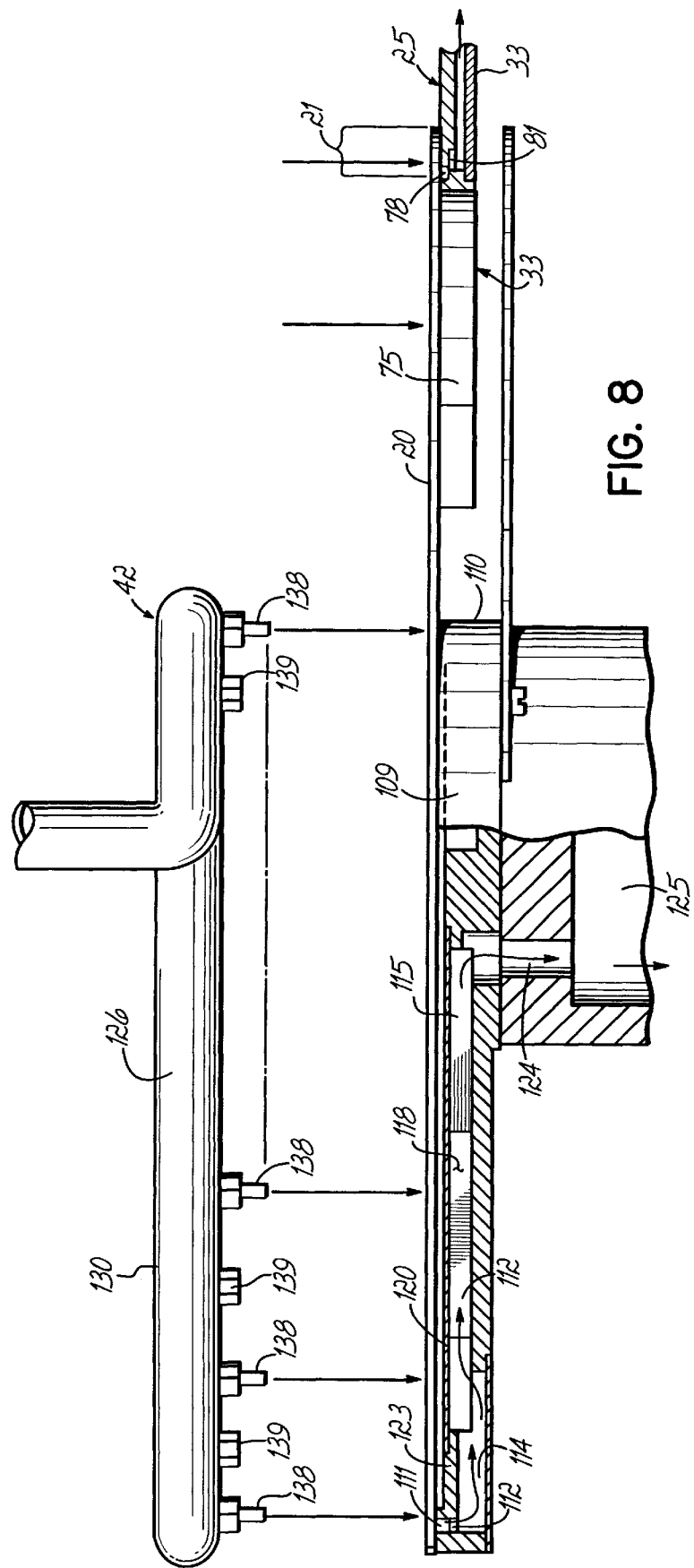
FIG. 8 is a sectional view taken along line 8—8 of FIG. 6.

Referring to FIGS. 1 and 6, the wafer aligning station 36 is positioned atop pedestal 14, which is adapted to allow the wafer cassette 17 to be positioned therebeneath. The wafer aligning station 36 is operable for centering and aligning the orientation of the wafer 20 as understood by those of ordinary skill in the art. The aligning station vacuum chuck 34 include a rim 108 that extends about the perimeter of, and projects above the planar surface of, a generally planar platen 109. The rim 108 is positioned and has a diameter and width, W, adapted to contact wafer 20 within the exclusion area 21. The platen 109 is recessed below the horizontal plane of the rim 108 to ensure that, when wafer 20 is held by the aligning station vacuum chuck 34, the surface of wafer 20 peripherally inside the exclusion area 21 is not contacted by any portion of vacuum chuck 34. With reference to FIGS. 6 and 8, the platen 109 is disk-shaped and has a contoured side edge 110 shaped such that the end effector 25 can place wafer 20 onto the aligning station vacuum chuck 34 and then lower and retract, or, for removing wafer 20, such that the end effector 25 can be positioned beneath wafer 20 residing on the vacuum chuck 34, raise and retract.

With reference to FIG. 6, the rim 108 is provided with a circumferential groove 111 having a plurality of vacuum ports 112. Vacuum ports 112 are connected via a respective one of a plurality of vacuum passageways 114 to one of the two vacuum plenums 115, 116. Vacuum plenums 115, 116 are separated by a barrier wall 117. The vacuum ports 112 have substantially oval cross-sections and the vacuum passageways 114 have substantially rectangular cross-sections. Vacuum plenum 115 is provided with two flow diverters 118 and vacuum plenum 116 includes two flow diverters 118 (shown in dashed line). Flow diverters 118 are generally wedge-shaped structures and extend upwardly from a base surface 120 defining a lower wall of each vacuum plenum 115, 116. The flow diverters 118 may contact the bottom sides of two plenum covers 120 that are integrated into corresponding openings in platen 109 in an air-tight fashion.

The flow diverters 118 divide each of the vacuum plenums 115, 116 into a plurality of substantially radially-oriented vacuum channels 122. The plenum covers 120 are configured to provide a substantially gas-tight seal with corresponding ledges 123 extending about the entire perimeter of vacuum plenums 115, 116, respectively, so that the only pathway for gas to flow from enclosure 12 into vacuum plenums 115, 116 is through the vacuum ports 112.

In the illustrated exemplary embodiment, each vacuum plenum 115, 116 is provided with a pair of the plurality of flow diverters 118 and three of the plurality of vacuum ports 112. However, the present invention is not so limited and each vacuum plenum 115, 116 may be provided with a lesser or greater number of either flow diverters 118 or vacuum ports 112. Moreover, the number of vacuum plenums 115, 116 may be increased or decreased without departing from the spirit and scope of the present invention. For example, plenums 115, 116 may be merged into a single plenum.

Figure 7:
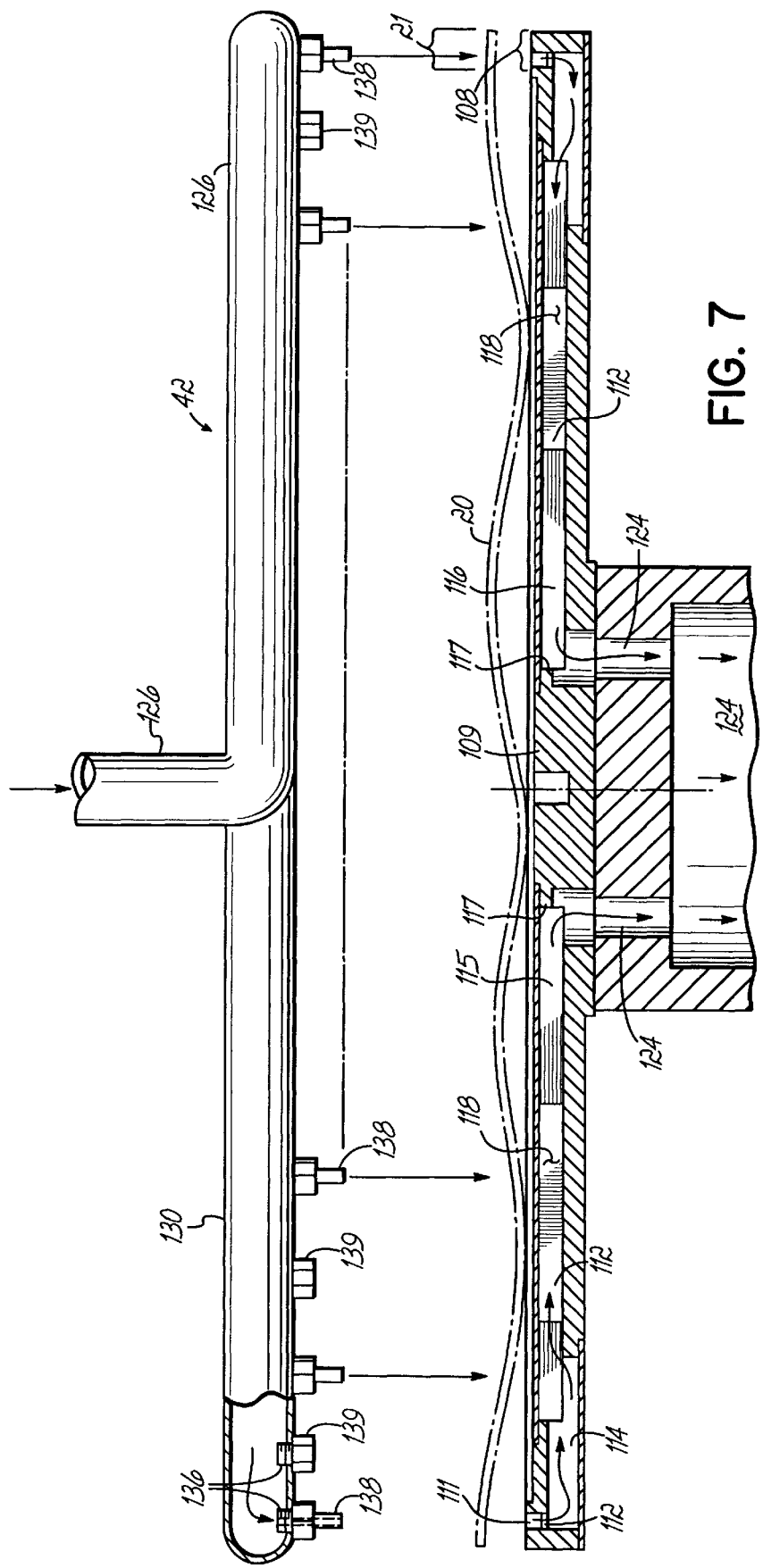
FIG. 7 is a sectional view taken along line 7—7 of FIG. 6.

Referring to FIG. 7, the vacuum plenums 115, 116 are connected for fluid communication with a respective one of a pair of segmented vacuum ducts 124 disposed inside the wafer aligning station 36. The vacuum ducts 124 are in fluid communication with an internal cavity 125 inside the wafer aligning station 36 that is evacuated by the selectively operable vacuum source 100. In an exemplary embodiment for securing a wafer 20 of silicon having a 150 mm diameter and up to a 12.5 mm warpage, a suitable vacuum pressure, measured near the vacuum source 100, is about 250 mTorr. Gas molecules can enter one of the vacuum ports 112 under the influence of the suction provided by the vacuum source 100 unless or until the vacuum port 112 is blocked by the presence of a portion of wafer 20, typically a portion within the exclusion area 21. Until a specific one of vacuum ports 112 is blocked, gas molecules from within the enclosure 12 are free to pass along a pathway, as diagrammatically shown by the gas flow lines, from vacuum port 112 to the vacuum passageway 114 to the respective one of two vacuum plenums 115, 116 to the respective one of ducts 124 and are evacuated through the internal cavity 125 for exhaust by the selectively operable vacuum source 100.

According to the present invention, the flow diverters 118 optimize the distribution of the forces applied to the exclusion area 21 of the wafer 20, which is to be held in contact with rim 108, by diverting the suction or gas flow to vacuum ports 112 that are uncovered as certain ones of vacuum ports 112 are sequentially blocked or occluded by the exclusion area 21. As a result, the attractive force applied by the vacuum from each of the vacuum ports 112 to wafer 20 can be dynamically adjusted. When the end effector 25 is positioned such that the exclusion area 21 of the wafer 20 is proximate to the vacuum ports 112, the attractive force applied by suction of one of the vacuum ports 112 will act on the nearby surface area of the wafer 20. The portion of the wafer 20 lying closest to a first of the vacuum ports 112 will experience the greatest initial attractive force and be drawn into contact with the rim 108, which thereby blocks the first of the vacuum ports 112. Because the flow diverters 114 preferentially divert the suction or vacuum pressure to vacuum ports 112 that remain uncovered and the corresponding vacuum channels 122, the attractive force applied to the nearby portions of the wafer 20 by the uncovered ones of vacuum ports 112 will be increased. As the vacuum ports 112 are sequentially covered by the portions of the exclusion area 21 of the wafer 20, the suction or vacuum pressure applied by the remaining uncovered vacuum ports 112 will be increased as the vacuum is increased in the respective vacuum channels 122. This sequence repeats until the exclusion area 21 of the wafer 20 is attracted to contact a significant portion of the rim 108, as indicated in FIG. 8, and thereby be secured thereto. The gradual blockage of vacuum ports 112 by the exclusion area 21 of the surface of the wafer 20 eventually activates a wafer presence detector (not shown) which sends a signal to the control system indicating that the aligning station vacuum chuck 34 has successfully captured wafer 20 against rim 108.

If wafer 20 is a thin wafer having significant warpage and significant flexibility, the aligning station vacuum chuck 34 is ideally suited for establishing a secure contact between rim 108 and the exclusion area 21 of wafer 20. As vacuum ports 112 are gradually occluded, the vacuum ports 112 that remain unblocked apply a greater attractive suction force to the remaining portions of the exclusion area 21 of wafer 20, which are more distance from rim 108 due to the presence of the warpage. The enhancement in the attractive suction force is more likely to attract these more distant portions of exclusion area 21 to contact rim 108.

With reference to FIGS. 1, 6, 7 and 8, the gas dispensing showerhead 42 comprises a tubular member 126 suspended by a bracket 128 within enclosure 12. The tubular member 126 has a semi-circular, ring-shaped portion 130 with a spaced relationship above the wafer aligning station 36. The ring-shaped portion 130 is substantially centered above the aligning station vacuum chuck 34 such that, when a wafer 20 is present on vacuum chuck 34, the ring-shaped portion 130 at least partially overlies the exclusion area 21 of the wafer 20. Generally, the ring-shaped portion 130 encircles the portion of the exclusion area 21 of the wafer 20, which overlies the aligning station vacuum chuck 34. However, the present invention is not so limited and the ring-shaped portion 130 may encircle and overlie the entire exclusion area 21 of wafer 20. The spacing between the ring-shaped portion 130 and the aligning station vacuum chuck 34 permits wafer 20 to be raised and lowered, accounting for warpage thereof, without a significant risk of contact therebetween that could damage wafer 20 or devices thereon. For 150 mm wafers with 12.5 mm of warpage, for example, the spacing between the ring-shaped portion 130 and the aligning station vacuum chuck 34 is suitable if greater than or equal to about 5 cm.

The tubular member 126 extends to provide a gas inlet 131 selectively connected for fluid continuity via a solenoid valve 132 with a gas supply line 133 in fluid communication with a gas source 134 of a pressurized wafer-flattening gas, such as clean dry air or nitrogen. The solenoid valve 132 is provided to control the flow of wafer-flattening gas flowing into to the gas inlet 131 of tubular member 126, as instructed by the control system for the wafer handling system 10. As a result, the gas source 134 is selectively operable by the control system for providing a burst or a continuous flow of the wafer-flattening gas to the gas dispensing showerhead 42. A typical pressure for the wafer-flattening gas, measured at the solenoid valve 132 for the gas supply line ranges from about 40 pounds per square inch (p.s.i.) to about 60 p.s.i.

Referring to FIG. 7, the ring-shaped portion 130 of the tubular member 126 includes a plurality of openings 136 that are substantially uniformly spaced about the circumference thereof. Openings 136 are aligned in a substantially confronting relationship with the aligning station vacuum chuck 34. Certain ones of the openings 136 include gas outlets or nozzles 138 for dispensing wafer-flattening gas therethrough and others of the openings 136 are blocked with plugs 139. The number and arrangement of the nozzles 138 and plugs 139 in openings 136 for supplying the wafer-flattening gas depends on parameters such as the gas pressure, the characteristics of the wafer warpage, and the separation distance between the gas dispensing showerhead 42 and the confronting surface of wafer 20. The parameters are adjusted and optimized for the particular wafers 20 being handled by the transfer operation. In an exemplary embodiment for aiding a vacuum chuck to secure a wafer 20 of silicon having a 150 mm diameter and up to a 12.5 mm warpage, a suitable number of nozzles 138 ranges from about 10 to about 100, and each nozzle 138 has an exit orifice with a diameter of about 10 microns. The gas dispensing showerhead 42 may be also used in conjunction with an electrostatic chuck or any other type of holding or clipping device in an application that requires that a thin wafer 20, or other warped substrate, be held flat without departing from the spirit and scope of the present invention. Those of ordinary skill in the art will appreciate that the openings 136 may be adapted to provide suitably sized gas outlets for emitting the wafer-flattening gas without the provision of nozzles 138 and that the openings 136 may be non-uniformly spaced about the circumference of the ring-shaped portion 130 of the tubular member 126.

With continued reference to FIGS. 7 and 8, the aligning station vacuum chuck 34 and the gas dispensing showerhead 42 are particularly effective, when used together, for securing wafer 20 to the surface of the vacuum chuck 34, for example, if wafer 20 has a significant warpage. When the wafer 20 is initially placed on the aligning station vacuum chuck 34, the exclusion area 21 of wafer 20 makes contacts with rim 108 at only a few spaced points. In this initial condition, the aligning station vacuum chuck 34 lacks sufficient suction to secure the exclusion area 21 of wafer 20 against the rim 108. As shown in FIG. 7, vacuum is supplied to vacuum ports 112 contemporaneously with a flow or burst of wafer-flattening gas from the nozzles 138 of gas dispensing showerhead 42, which applies a momentary or continuous force that flattens wafer 20 against a significant portion of the rim 108 for assisting the aligning station vacuum chuck 34 to grasp and secure the exclusion area 21 of wafer 20.

With reference to FIG. 1, the load arm vacuum chucks 38 and 39 have internal vacuum plenums that are connected to the selectively operable vacuum source 100 by either an external vacuum line 101 or by disposing at least one internal vacuum passageway (not shown) within the load arm 40 and load arm chucks 38, 39. The vacuum plenums (not shown) of the load arm vacuum chucks 38, 39 may be configured with vacuum diverters (not shown), similar to vacuum diverters 118 positioned in the aligning station vacuum chuck 34, for enhancing the ability of vacuum chucks 38, 39 to grasp and hold wafers 20, such as thin wafers. Suspended by a bracket 140 above the load arm vacuum chuck 38 is a gas dispensing showerhead 43, which is substantially identical to gas dispensing showerhead 42. Gas dispensing showerhead 43 is connected in fluid communication via a solenoid valve 142 to gas source 134 and is operable for exhausting a flow of a wafer-flattening gas that furnishes a downward force about at least the exclusion area 21 of the wafer 20 for assisting the load arm vacuum chuck 38 to securely engage the exclusion area 21 of the wafer 20.

In a loading operation for supplying a wafer 20 from wafer cassette 16 to the wafer processing machine 12, the robot 26 extends the end effector 25 to a position such that the end effector vacuum chuck 33 is directly beneath the exclusion area 21 of one of the wafer 20 held by the rack 19. The end effector vacuum chuck 33 is switched on and the robot 26 raises the end effector 25 vertically. A change in the vacuum pressure in the vacuum supply line to the aligning station vacuum chuck 36 indicates that the exclusion area 21 of the wafer 20 has sealed the vacuum ports 77–79 of the vacuum chuck 36. If a wafer 20 should not be present, the vacuum pressure does not change and the control system for the wafer handling system 10 deduces that the rack position was empty. After an effective vacuum seal is established, the end effector 25 elevates the wafer 20 above the slots of the rack 19 and retracts from the vicinity of the wafer cassette 16, while holding and supporting wafer 20. The robot 26 rotates about z-axis 27 and extends the wafer transfer arm 30 to move end effector 25 and wafer 20 toward the wafer aligning station 36.

As the end effector 25 approaches the wafer aligning station 36, the optical sensor 103 detects the optical reflector 106 and, thereby, senses the presence of the end effector 25. The control system opens the vacuum supply line to the aligning station vacuum chuck 34 and opens solenoid valve 132 to allow a brief flow of wafer-flattening gas to flow from the gas dispensing showerhead 42. The end effector 25 lowers and places the wafer 20 on the aligning station vacuum chuck 34. The suction provided by the aligning station vacuum chuck 34 and the burst of wafer-flattening gas from the gas dispensing showerhead 42 apply additive forces to at least the exclusion area 21 of wafer 20 with a consistent direction so the wafer 20 is urged to flatten. When flattened, wafer 20 lies in a horizontal plane substantially parallel to and in contact with the support surface 74 of the aligning station vacuum chuck 34 and held in place by the pressure differential between atmospheric pressure acting on the surface of wafer 20 and the vacuum pressure applied to the backside of wafer 20 via vacuum ports 112. This result may be achieved even though wafer 20 may be initially warped, wavy, or bowed when provided to the aligning station vacuum chuck 34 by end effector 25.

The vacuum to the aligning station vacuum chuck 34 is valved off so that wafer 20 can be centered by a method familiar to those of ordinary skill in the art. After centering, vacuum is reestablished to the aligning station vacuum chuck 34 and solenoid valve 132 is actuated so that a burst of wafer-flattening gas is emitted by the gas dispensing showerhead 42 to flatten wafer 20. If an adequate vacuum seal exists between the exclusion area 21 of the wafer 20 and the aligning station vacuum chuck 34, as indicated by a variation of the vacuum pressure detected by a pressure sensor monitoring the vacuum line supplying vacuum chuck 34, the wafer aligning station 36 is raised and, thereafter, the flat or notch on the wafer 20 is aligned by a method known to those of ordinary skill in the art.

After alignment, the robot 26 extends the end effector 25 beneath the centered and aligned wafer 20 and raises the end effector 25 to elevate the wafer 20 above the rim 108 of the aligning station vacuum chuck 34. The end effector 25 is then retracted from the wafer aligning station 36 and moved to the vicinity of the load arm 40. As the end effector 25 nears the home position of the load arm 40, the optical sensor 104 senses the optical reflector 106 on the end effector 25 and signals the control system to actuate solenoid valve 142 for emitting a burst of wafer-flattening gas from gas dispensing showerhead 43 and to open the vacuum supply line to the load arm vacuum chuck 38. As the wafer 20 is lowered, the burst of wafer-flattening gas flattens wafer 20 and a vacuum seal is made between the exclusion area 21 of wafer 20 and the load arm vacuum chuck 38. The presence of the wafer 20 on the vacuum chuck 38 and the existence of an adequate vacuum seal is sensed by a pressure sensor positioned in the vacuum line supplying vacuum chuck 38. The vacuum is switched off to the end effector vacuum chuck 33 and the robot 26 retracts the end effector 25 from the load arm vacuum chuck 38. Thereafter, the load arm 40 is moved to place the wafer 20 on the load arm vacuum chuck 38 into the loadlock chamber 154 of the wafer processing machine 41 and onto a wafer holder therein. The load arm 40 is then returned to its home position. While within the loadlock chamber 154, the load arm 40 can utilize load arm vacuum chuck 39 to grasp and retrieve a one of wafers 20 that has been processed by wafer processing machine 41.

In an unloading operation for removing a wafer 20 into the wafer processing machine 41, the load arm 40 is moved from its home position, shown in FIG. 1, to retrieve the wafer 20 from a wafer holder positioned in the loadlock chamber 154 of the wafer processing machine 41. Load arm vacuum chuck 39 engages the wafer 20 within the loadlock chamber 154 and the load arm 40 returns to its home position while rotating the load arm vacuum chuck 39 so that the wafer 20 retrieved from the loadlock chamber 154 is upwardly facing toward gas dispensing showerhead 43. In high-throughput wafer handling, load arm vacuum chuck 38 will hold a one of the wafers 20 that is unprocessed and the load arm 40 will place that wafer 20 in the wafer holder in the loadlock chamber 154 after the wafer 20 that has been processed is positioned on load arm vacuum chuck 39. The end effector 25 extends to a position such that the end effector vacuum chuck 33 is directly beneath the exclusion area 21 of the wafer 20 on load arm vacuum chuck 39.

As the end effector 25 approaches the load arm 40, the optical sensor 104 detects the optical reflector 106 on the end effector 25 and sends a signal to the control system for the wafer handling system 10 to open solenoid valve 142 for emitting wafer-flattening gas from the gas dispensing showerhead 43 and to open the vacuum supply line to the load arm vacuum chuck 39. The force applied by the wafer-flattening gas flowing from gas dispensing showerhead 43 urges the wafer 20 to remain flat and lie in a plane substantially parallel to and in contact with the flat support surface of the load arm vacuum chuck 39. The vacuum line to the end effector vacuum chuck 33 is opened to apply a vacuum pressure to vacuum ports 77–79 and the robot 26 raises the end effector 25 vertically to contact the bottom of the wafer 20 within the exclusion area 21. A pressure sensor monitors for a change in the vacuum pressure in the vacuum line supplying end effector vacuum chuck 33. A change in vacuum pressure indicates that the exclusion area 21 of the wafer 20 has blocked or occluded the vacuum ports 77–79 of the end effector vacuum chuck 33. After an effective vacuum seal exists, the robot 26 raises the end effector 25 to lift the wafer 20 from the support surface of the load arm chuck 39. The robot 26 then retracts the end effector 25 from the vicinity of the load arm 40. Accordingly, the optical sensor 104 detects the removal of the optical reflector 106 and signals the control system to close solenoid valve 142 and thereby halt the flow of wafer-flattening gas to gas dispensing showerhead 43. The robot 26 extends the end effector 25 adjacent a pair of slots 32 providing an open rack position in rack 19 of wafer cassette 18 and inserts the wafer 20 therein. The vacuum line supplying end effector vacuum chuck 33 is valved off as the robot 26 lowers the end effector 25 and then the robot 26 retracts the end effector 25 to a location in preparation for the next wafer handling operation.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. An apparatus for flattening a warped thin wafer with wafer-flattening gas from a source of a wafer-flattening gas, the wafer having a first surface, an opposite second surface, and an annular exclusion area on the first surface extending radially inwardly a predetermined distance from a peripheral rim of the wafer, comprising:

a wafer support having a support surface adapted for contacting at least the exclusion area on the first surface of the wafer and a plurality of vacuum ports in the support surface for applying an attractive suction force to the first surface of the wafer in the exclusion area; and a gas dispensing showerhead coupled in fluid communication with the source of wafer-flattening gas, said showerhead being suspended above the second surface of the wafer in a non-contacting relation hip so as to confront the second surface of the wafer, and said showerhead having a plurality of gas outlets each adapted to direct a corresponding flow of the wafer-flattening gas toward the second surface of the wafer for applying a force directed to flatten the first surface of the wafer against said support surface such that at least a portion of the exclusion area moves closer to at least one of said plurality of vacuum ports.

2. The apparatus of claim 1 wherein said support surface has a central axis and said gas showerhead includes a circular tubular member generally concentric with said central axis, said plurality of gas outlets arranged about a circumference of said tubular member.

3. The apparatus of claim 1 further comprising a plurality of nozzles each attached to a corresponding one of said plurality of gas outlets, each of said plurality of nozzles having an orifice therein oriented to direct the corresponding flow of wafer-flattening gas against the second surface of the wafer.

4. The apparatus of claim 1 further comprising a plurality of nozzles attached to a first number of said plurality of gas outlets, each of said nozzles having an orifice therein oriented to direct the corresponding flow of wafer-flattening gas against the second surface of a wafer supported on said support surface, and a plurality of plugs attached to a second number of said plurality of gas outlets, wherein said plurality of nozzles and said plurality of plugs are configured and positioned to spatially tailor the flow of wafer-flattening gas toward the wafer.

5. The apparatus of claim 1 wherein said gas outlets are adapted to direct the corresponding flow of wafer-flattening gas generally toward the annular exclusion area of the wafer supported on said support surface.

6. The apparatus of claim 5 wherein said gas outlets are arranged with angular spacings about a circumference of said showerhead, said gas outlets overlying the exclusion area of the wafer supported on said support surface.

7. The apparatus of claim 1 wherein said first support surface includes a plurality of first vacuum ports operable for applying an attractive suction force to a contacted portion of the exclusion area, and said gas ports generally direct the corresponding flows of wafer-flattening gas toward the portion of the annular exclusion area which said first support surface is adapted to contact.

8. A method for securing a warped thin wafer against a support surface having vacuum ports for applying an attractive suction force to the wafer, the wafer having a first surface, an opposite second surface, and an annular exclusion area on the first surface extending radially inwardly a predetermined distance from a peripheral rim of the wafer, the method comprising:

positioning the first surface of the wafer proximate to the support surface;

applying an attractive suction force from vacuum ports in the support surface to the first surface of the wafer in the exclusion area; and directing a flow of wafer-flattening gas against the second surface of the wafer for applying a force that flattens the first surface of the wafer against the support surface such that at least a portion of the exclusion area moves closer to at least one of the vacuum ports.

9. The method of claim 8 wherein the support surface is substantially planar, and further comprising adjusting the spatial distribution of the flow of the wafer-flattening gas to the second surface of the wafer so as to press the first surface of the wafer substantially coextensively against the support surface.

10. The method of claim 8 wherein the step of directing comprises orienting at least part of the flow of the wafer-flattening gas in the general direction of the annular exclusion area.

11. The method of claim 8, wherein the support surface is annular, and the step of directing further comprises orienting at least part of the flow of the wafer-flattening gas generally toward the exclusion area of the wafer.

* * * * *

UNITED STATES PATENT AND TRADEMARK OFFICE
CERTIFICATE OF CORRECTION

PATENT NO. : 6,612,590 B2
DATED : September 2, 2003
INVENTOR(S) : Coomer et al.

It is certified that error appears in the above-identified patent and that said Letters Patent is hereby corrected as shown below:

Column 2,
Lines 41-56, paragraph should not be indented.
Line 52, reads "are of the wafer to the contact the chuck" and should read -- are of the wafer to contact the chuck --.

Column 5,
Line 24, reads "illustrated in phantom containing" and should read -- illustrated in phantom, containing --.
Line 39, reads "chamber 51" and should read -- chamber 151 --.

Column 9,
Line 36, reads "via a vacuum line" and should read -- via a vacuum line 101 --.

Column 16,
Line 26, reads "relation hip" and should read -- relationship --.

Signed and Sealed this

Eleventh Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO.    : 6,612,590 B2
DATED         : September 2, 2003
INVENTOR(S)   : Coomer et al.

It is certified that error appears in the above-identified patent and that said Letters Patent is hereby corrected as shown below:

Column 2,
Lines 41-56, paragraph should not be indented.
Line 52, reads "are of the wafer to the contact the chuck" and should read -- area of the wafer to contact the chuck --.

Column 5,
Line 24, reads "illustrated in phantom containing" and should read -- illustrated in phantom, containing --.
Line 39, reads "chamber 51" and should read -- chamber 151 --.

Column 9,
Line 36, reads "via a vacuum line" and should read -- via a vacuum line 101 --.

Column 16,
Line 26, reads "relation hip" and should read -- relationship --.

This certificate supersedes Certificate of Correction issued May 11, 2004.

Signed and Sealed this

Tenth Day of August, 2004

JON W. DUDAS
*Acting Director of the United States Patent and Trademark Office*